United States Patent
Akram

(10) Patent No.: US 8,129,764 B2
(45) Date of Patent: Mar. 6, 2012

(54) IMAGER DEVICES HAVING DIFFERING GATE STACK SIDEWALL SPACERS, METHOD FOR FORMING SUCH IMAGER DEVICES, AND SYSTEMS INCLUDING SUCH IMAGER DEVICES

(75) Inventor: Salman Akram, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 809 days.

(21) Appl. No.: 12/137,041

(22) Filed: Jun. 11, 2008

(65) Prior Publication Data
US 2009/0309142 A1   Dec. 17, 2009

(51) Int. Cl.
*H01L 31/062* (2006.01)

(52) U.S. Cl. .. 257/292; 257/290; 257/291; 257/E27.133

(58) Field of Classification Search .......... 257/290–292, 257/E27.133
See application file for complete search history.

(56) References Cited

U.S. PATENT DOCUMENTS

| | | |
|---|---|---|
| 4,356,623 A | 11/1982 | Hunter |
| 5,231,056 A | 7/1993 | Sandhu |
| 5,346,836 A | 9/1994 | Manning et al. |
| 5,576,228 A | 11/1996 | Chen et al. |
| 5,641,698 A | 6/1997 | Lin |
| 5,863,820 A | 1/1999 | Huang |
| 5,960,303 A | 9/1999 | Hill |
| 5,966,606 A | 10/1999 | Ono |
| 6,046,098 A | 4/2000 | Iyer |
| 6,046,105 A | 4/2000 | Kittl et al. |
| 6,104,063 A | 8/2000 | Fulford, Jr. et al. |
| 6,147,405 A | 11/2000 | Hu |
| 6,153,534 A | 11/2000 | Long et al. |
| 6,194,258 B1 | 2/2001 | Wuu |
| 6,235,630 B1 | 5/2001 | Akram et al. |
| 6,281,101 B1 | 8/2001 | Iyer |
| 6,284,584 B1 | 9/2001 | Hodges et al. |
| 6,294,464 B1 | 9/2001 | Trivedi |
| 6,303,452 B1 | 10/2001 | Chen et al. |
| 6,319,779 B1 | 11/2001 | Ahmad et al. |
| 6,410,420 B2 | 6/2002 | Akram et al. |
| 6,455,935 B1 | 9/2002 | Hu |
| 6,458,702 B1 | 10/2002 | Aloni |
| 6,514,811 B2 | 2/2003 | Hodges et al. |
| 6,514,859 B1 | 2/2003 | Erhardt et al. |
| 6,524,953 B1 | 2/2003 | Hu |
| 6,528,422 B1 | 3/2003 | Huang et al. |
| 6,555,425 B2 | 4/2003 | Huang et al. |

(Continued)

OTHER PUBLICATIONS

Dhong et al., Sidewall Spacer Technology for MOS and Bipolar Devices, J. Electrochem. Soc. Solid-State Science and Technology, vol. 133, No. 2, pp. 389-396, 1986.

*Primary Examiner* — Kenneth Parker
*Assistant Examiner* — Jose R Diaz

(57) ABSTRACT

Imager devices have a sensor array and a peripheral region at least partially surrounding the sensor array. At least one transistor in the peripheral region has a gate stack sidewall spacer that differs in composition from a gate stack sidewall spacer on at least one transistor in the sensor array. Imaging systems include such an imager device configured to communicate electrically with at least one electronic signal processor and at least one memory storage device. Methods of forming such imager devices include providing layers of oxide and nitride materials over transistors on a workpiece, and using etching processes to form gate stack sidewall spacers on the transistors.

8 Claims, 15 Drawing Sheets

U.S. PATENT DOCUMENTS

| | | |
|---|---|---|
| 6,569,700 B2 | 5/2003 | Yang |
| 6,569,784 B1 | 5/2003 | Wang et al. |
| 6,593,617 B1 | 7/2003 | Boyd et al. |
| 6,599,832 B2 | 7/2003 | Akram et al. |
| 6,602,774 B1 | 8/2003 | Fontana et al. |
| 6,605,533 B2 | 8/2003 | Trivedi |
| 6,607,951 B2 | 8/2003 | Chen et al. |
| 6,642,076 B1 | 11/2003 | Yaung et al. |
| 6,661,064 B2 | 12/2003 | Hodges et al. |
| 6,686,276 B2 | 2/2004 | Edrei et al. |
| 6,700,163 B2 | 3/2004 | Breitwisch et al. |
| 6,716,745 B2 | 4/2004 | Akram et al. |
| 6,724,051 B1 | 4/2004 | Woo et al. |
| 6,737,291 B1 | 5/2004 | Lim |
| 6,825,113 B2 | 11/2004 | Hu |
| 6,852,589 B2 | 2/2005 | Huang et al. |
| 6,881,663 B2 | 4/2005 | Akram et al. |
| 6,881,672 B2 | 4/2005 | Breitwisch et al. |
| 6,881,986 B1 | 4/2005 | Chiou et al. |
| 6,897,504 B2 | 5/2005 | Yaung et al. |
| 6,900,507 B1 | 5/2005 | Hong |
| 6,908,839 B2 | 6/2005 | Rhodes |
| 6,911,695 B2 | 6/2005 | Ahmed et al. |
| 6,943,077 B2 | 9/2005 | Liu et al. |
| 6,967,073 B2 | 11/2005 | Fasen et al. |
| 6,995,081 B2 | 2/2006 | Vaartstra |
| 7,012,000 B2 | 3/2006 | Hong |
| 7,122,840 B2 | 10/2006 | Hsu et al. |
| 7,164,447 B2 | 1/2007 | Takahashi |
| 2001/0012225 A1 | 8/2001 | Rhodes |
| 2001/0022371 A1 | 9/2001 | Rhodes |
| 2001/0032979 A1 | 10/2001 | Rhodes |
| 2001/0050382 A1 | 12/2001 | Rhodes et al. |
| 2002/0011614 A1 | 1/2002 | Rhodes |
| 2002/0089004 A1 | 7/2002 | Rhodes |
| 2002/0096733 A1 | 7/2002 | Rhodes |
| 2002/0109157 A1 | 8/2002 | Rhodes |
| 2002/0117690 A1 | 8/2002 | Rhodes |
| 2003/0042488 A1 | 3/2003 | Rhodes |
| 2003/0138985 A1 | 7/2003 | Rhodes |
| 2003/0173572 A1 | 9/2003 | Rhodes et al. |
| 2004/0046104 A1 | 3/2004 | Rhodes |
| 2004/0053436 A1 | 3/2004 | Rhodes |
| 2004/0140491 A1 | 7/2004 | Rhodes et al. |
| 2004/0173799 A1 | 9/2004 | Patrick |
| 2004/0195600 A1 | 10/2004 | Rhodes |
| 2004/0253761 A1 | 12/2004 | Rhodes et al. |
| 2005/0061950 A1 | 3/2005 | Jiang et al. |
| 2005/0082582 A1 | 4/2005 | Rhodes |
| 2005/0112789 A1 | 5/2005 | Rhodes et al. |
| 2005/0148114 A1 | 7/2005 | Rhodes |
| 2005/0205905 A1 | 9/2005 | Rhodes |
| 2006/0208289 A1* | 9/2006 | Ohkawa et al. ............. 257/291 |
| 2008/0029793 A1* | 2/2008 | Watanabe et al. ............ 257/291 |

* cited by examiner

FIG. 4A  FIG. 4B

IMAGER DEVICES HAVING DIFFERING GATE STACK SIDEWALL SPACERS, METHOD FOR FORMING SUCH IMAGER DEVICES, AND SYSTEMS INCLUDING SUCH IMAGER DEVICES

FIELD OF THE INVENTION

The present invention relates broadly to methods for forming semiconductor devices, to semiconductor devices formed using such methods, and to electronic systems including such semiconductor devices. More particularly, the present invention relates to methods for forming gate stack sidewall spacers in imager devices, to imager devices including such sidewall spacers, and to electronic imaging systems including such imager devices.

BACKGROUND OF THE INVENTION

Microelectronic imagers are devices used to capture images in a wide variety of electronic devices and systems including, for example, digital cameras, cellular telephones, computers, personal digital assistants (PDAs), etc. The number of microelectronic imagers produced each year has been steadily increasing as they become smaller and capable of capturing images of improved resolution.

Microelectronic imagers typically include a sensor array comprising a plurality of photosensitive devices, each of which is configured to generate an electrical signal in response to electromagnetic radiation (e.g., visible light) impinging thereon. The photosensitive devices of an imager may include, for example, photodiodes, phototransistors, photoconductors, or photogates. Furthermore, there are different types or configurations of such photosensitive devices including, for example, charged coupled devices (CCD), complementary metal-oxide semiconductor (CMOS) devices, or other solid-state devices. The photosensitive devices are arranged in an array in a focal plane. Each photosensitive device is sensitive to radiation in such a way that it can create an electrical charge that is proportional to the intensity of radiation striking the photosensitive device. The array of photosensitive devices is used to define a corresponding array of pixels, each of which is configured to detect the intensity of the radiation impinging thereon. A single pixel may include a single photosensitive device, or a pixel may be defined as a local group of nearest-neighbor photosensitive devices in the array of photosensitive devices. In some imagers, each pixel may be configured to detect radiation impinging thereon over a broad frequency range. Such pixels may be used to capture gray scale images. In additional imagers, each pixel may be configured for detecting a specific wavelength or range of wavelengths of radiation (i.e., a specific color of light) such as, for example, radiation in the visible red, green, or blue regions of the electromagnetic spectrum. In such embodiments, a full color image may be detected and captured with the proper combination of color sensing pixels.

Some CMOS imagers include an array of pixels in which each pixel includes a pixel circuit having three transistors (often referred to as a "3T" pixel circuit). Such 3T pixel circuits may include a photosensitive device for supplying charge (generated in response to radiation impinging thereon) to a diffusion region, a reset transistor for resetting the potential of the diffusion region, a source follower transistor having a gate connected to the diffusion region for producing an output signal, and a row select transistor for selectively connecting the source follower transistor to a column line of a sensor array. Other CMOS imagers include an array of pixels in which each pixel includes a pixel circuit having four transistors (often referred to as a "4T" pixel circuit). A 4T pixel circuit is similar to a 3T pixel circuit, but also includes a charge transfer transistor to selectively control flow of current from the photosensitive device to a sensing node such as a floating diffusion region.

In addition to the sensor array (which includes the photosensitive devices defining the pixels and the pixel circuits), microelectronic imagers may further include other components or subsystems such as, for example, a controller, a row decoder, a column decoder, memory, etc. Each of these components or subsystems, together with the sensor array, may be integrally formed on a substrate to form the microelectronic imager device. The substrate may include, for example, a full or partial wafer comprising a semiconductor material such as silicon, germanium, gallium arsenide, indium phosphide, or any other III-V type semiconductor material.

While conventional imager device designs and fabrication processes have achieved a relatively high level of commercial success, conventional imager device structures exhibit some undesirable structural characteristics and operational deficiencies. Thus, there is a continuing need in the art for microelectronic imager device designs and fabrication processes resulting in imager devices having increased efficiency, reliability and durability.

BRIEF DESCRIPTION OF THE SEVERAL VIEWS OF THE DRAWINGS

FIG. 4A is a top plan view illustrating one embodiment of a physical layout for each of the pixels of the imager device shown in FIGS. 3A and 3B;

FIG. 4B is a circuit diagram of the pixel shown in FIG. 4A;

DETAILED DESCRIPTION OF THE INVENTION

In the following detailed description, reference is made to the accompanying drawings which form a part hereof, and in which is shown by way of illustration specific embodiments in which the present invention may be practiced. These embodiments are described in sufficient detail to enable those skilled in the art to practice the present invention, and it is to be understood that other embodiments may be utilized, and that structural, logical, and electrical changes may be made without departing from the spirit and scope of the present invention.

In this description, circuits and functions may be shown in block diagram form in order not to obscure the present invention in unnecessary detail. Conversely, specific circuit implementations shown and described are only non-limiting examples, and should not be construed as the only way to implement the present invention unless specified otherwise herein. Additionally, block definitions and partitioning of logic between various blocks is only a non-limiting example of a specific implementation. It will be readily apparent to one of ordinary skill in the art that the present invention may be practiced by numerous other partitioning solutions.

Broadly, in some embodiments of the present invention, imager devices have a sensor array and a peripheral region at least partially surrounding the sensor array. At least one transistor in the peripheral region has gate stack sidewall spacers that differ in composition from gate stack sidewall spacers on at least one transistor in the sensor array. In additional embodiments of the present invention, imaging systems include at least one such imager device.

In yet additional embodiments of the present invention, methods of forming such imager devices include providing layers of oxide and nitride materials over transistors on a workpiece comprising a wafer or other substrate, and using etching processes to form gate stack sidewall spacers on the transistors.

Figure 1:
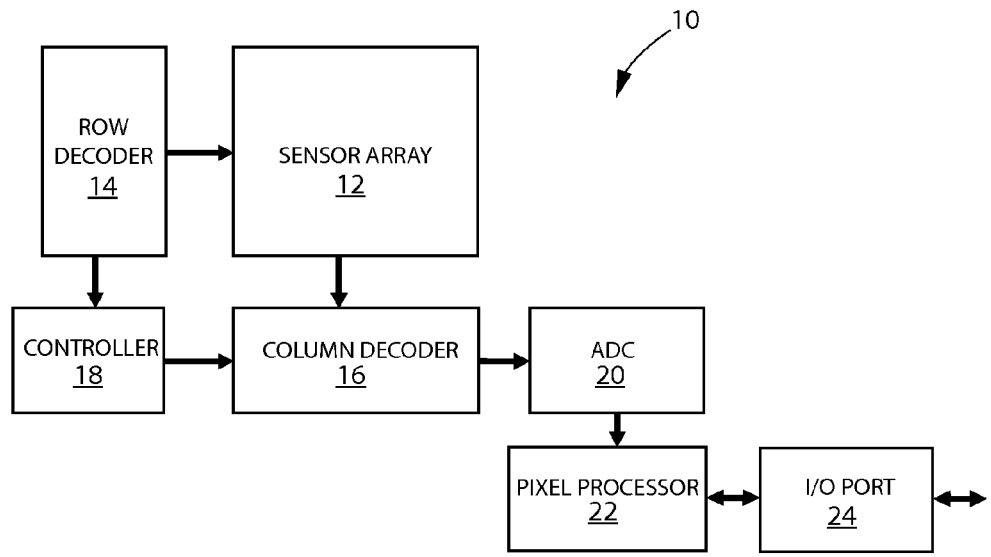
FIG. 1 is a simplified block diagram of an embodiment of an imager device of the present invention.

FIG. 1 is a simplified block diagram of an embodiment of an imager device 10 of the present invention. As shown in FIG. 1, the imager device 10 may include a sensor array 12, a row decoder 14, a column decoder 16, and a controller 18. The sensor array 12 includes a plurality of pixels, each comprising a pixel circuit. Each pixel circuit includes at least one photosensitive device such as, for example, a photodiode, a phototransistor, a photoconductor, or a photogate, as well as one or more array transistors, as described in further detail below.

The photosensitive device of each pixel circuit may be configured to generate an electrical charge, the magnitude of which may be proportional to the intensity of radiation impinging on the photosensitive device. Each pixel circuit in the sensor array is configured to detect the intensity of radiation impinging on the location of the sensor array in which the photosensitive device of that respective pixel circuit is located, and to generate an output signal. The overall image captured by the sensor array 12 comprises or is formed from the output signals acquired from each of the pixel circuits in the sensor array 12.

In some embodiments of the imager device 10, each photosensitive device may be configured to detect radiation impinging thereon over a broad frequency range, and the imager device 10 may be configured to capture gray scale images. In additional embodiments, each photosensitive device of the sensor array 12 may be configured for detecting a specific wavelength or range of wavelengths of radiation (i.e., a specific color of light) such as, for example, radiation in the visible red, green, or blue regions of the electromagnetic spectrum. In such embodiments, the imager device 10 may be configured to capture a full color image.

The pixels of the sensor array 12 may be arranged in individually addressable rows and columns such that the row decoder 14 can address each row of the sensor array 12 and the column decoder 16 can address each column of the sensor array 12. While not illustrated with connections in the block diagram shown in FIG. 1, the controller 18 may control functions of many or all of the other components or subsystems within the imager device 10. For example, the controller 18 may control the exposure time of the sensor array 12 when capturing an image and the sequencing of the row decoder 14 and column decoder 16 to read out the analog values of each pixel within the sensor array 12.

By way of example and not limitation, the row decoder 14 may select a specific row and the column decoder 16 may receive an output signal from every pixel in the selected row in parallel. The column decoder 16 then may sequence through each pixel within the selected row to determine the charge on each pixel. As the pixels are each individually addressed, the resulting analog signal from each pixel may be sequentially directed from the column decoder 16 to an analog-to-digital converter (ADC) 20. The analog to digital converter 20 may be used to convert the analog signal for each pixel to a digital signal representing the intensity of the radiation at each respective pixel.

The digital output signal for each pixel may be directed through a pixel processor 22. The pixel processor 22 may perform a number of functions on the digital output signal being processed. By way of example and not limitation, if the digital output signal for a particular pixel is identified as exhibiting unexpected values (which may indicate that the particular pixel includes an anomaly or defect), the value of the digital output signal for that respective pixel may be replaced with a new value. For example, the value may be replaced by the value of the digital output signal exhibited by a neighboring pixel or an average value from a number of neighboring pixels. In addition, other signal processing functions, such as, for example, filtering and compression may be performed by the pixel processor 22.

After processing, the digital output signal for each pixel may be transferred to an input/output (I/O) port 24 for transmission out of the imager device 10. The I/O port 24 may include a data memory or storage medium to store values from a number of pixels such that pixel values may be transferred out of the imager device 10 in a parallel or serial manner.

Figure 2:
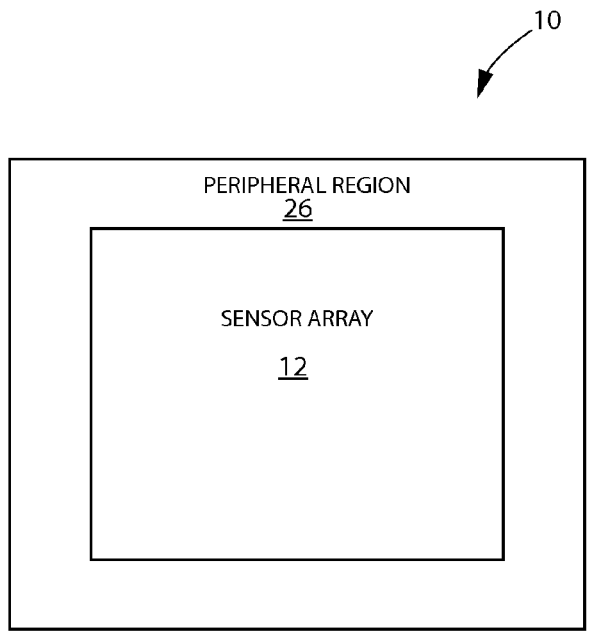
FIG. 2 is a top plan view illustrating an embodiment of a physical layout of a sensor array and peripheral circuitry for the embodiment of the imager device of FIG. 1.

FIG. 2 is a top plan view illustrating one embodiment of a physical layout that may be exhibited by the imager device 10. As shown in FIG. 2, in some embodiments, the sensor array 12 of the imager device 10 may be generally centrally located and entirely surrounded by a peripheral region 26. In some embodiments, one or more of the row decoder 14, column decoder 16, controller 18, analog to digital converter 20, pixel processor 22, and I/O port 24 (FIG. 1) may be located in the peripheral region 26 of the imager device 10. In additional embodiments, the sensor array 12 of the imager device 10 may not be centrally located and the peripheral region 26 may only partially surround the sensor array 12. For example, the peripheral region 26 may be disposed on only one, two, or three sides of the sensor array 12.

Figure 3A:
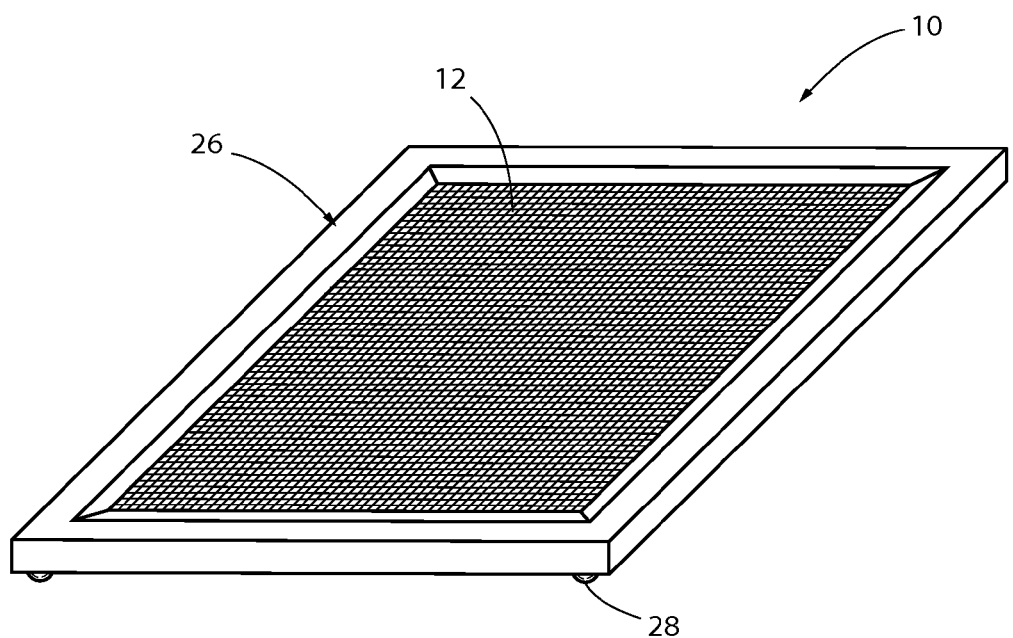
FIG. 3A is a perspective view illustrating one embodiment of the imager device of FIG. 1 that includes a CMOS sensor array.
Figure 3B:
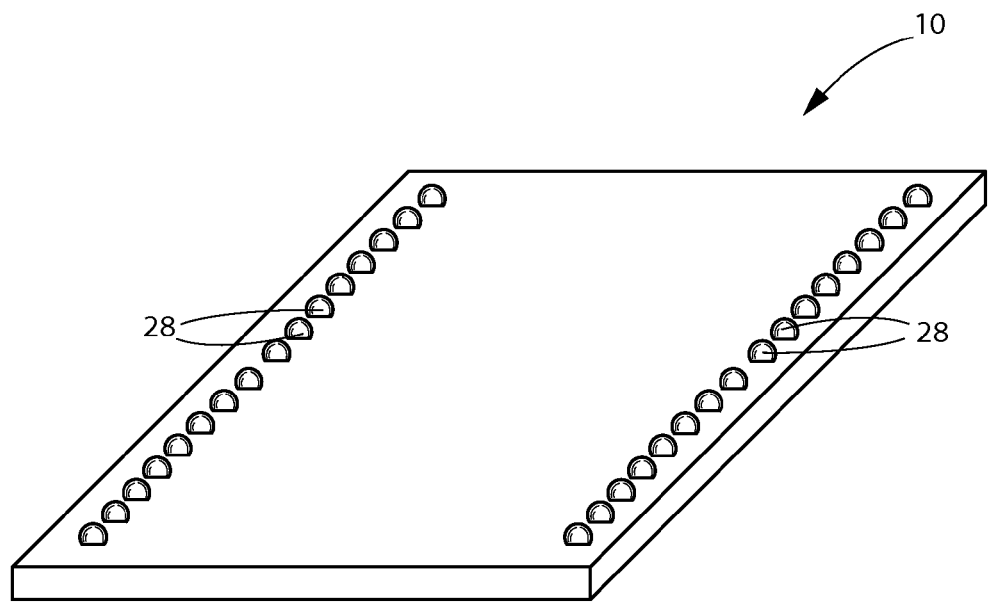
FIG. 3B is a perspective view of the embodiment of the imager device shown in FIG. 3A illustrating an opposite side thereof.

FIG. 3A is a perspective view of an upper surface of one particular embodiment of the imager device 10. As previously mentioned and as shown in FIG. 3A, the sensor array 12 may be substantially centrally located, and the peripheral region 26 may entirely surround the sensor array 12. FIG. 3B is a perspective view of an opposite side of the imager device 10 shown in FIG. 3A. As shown in FIG. 3B, the imager device 10 may include a plurality of conductive elements 28 for establishing electrical communication between the imager device 10 and a higher level substrate or device, such as, for example, a circuit board of an electronic device (e.g., a digital camera, a cellular telephone, a computer, a personal digital assistant (PDA), etc.).

A brief discussion of one embodiment of a pixel 30 (a plurality of which may be included in the sensor array 12) is set forth below with reference to FIGS. 4A-4C merely to provide a non-limiting example of the various types of photosensitive devices that may be incorporated in the sensor array 12.

Figure 4C:
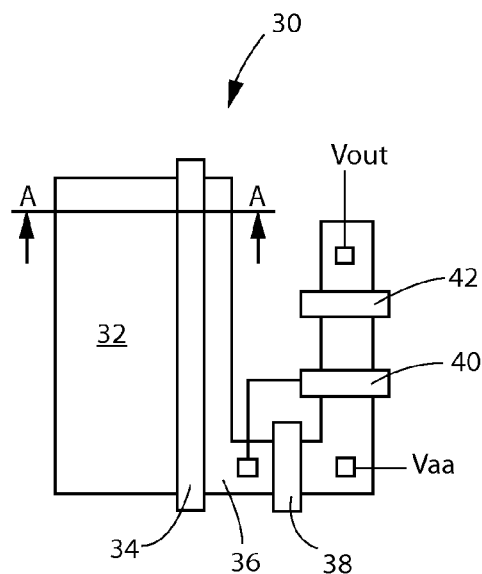
FIG. 4C is a partial cross-sectional view of the imager device shown in FIGS. 3A and 3B, the right hand side of which is a cross sectional view of the pixel shown in FIG. 4A, taken along section line A-A therein.
Figure 4C:
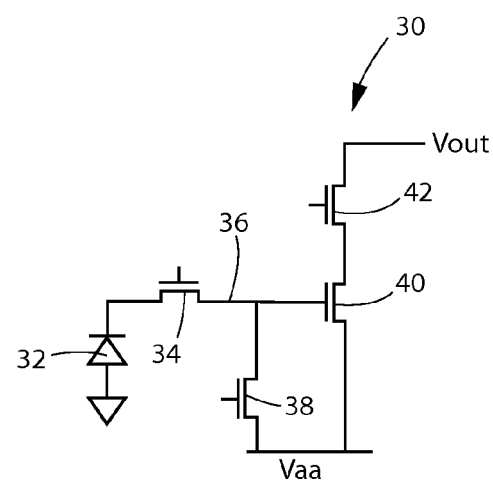
Figure 4C:
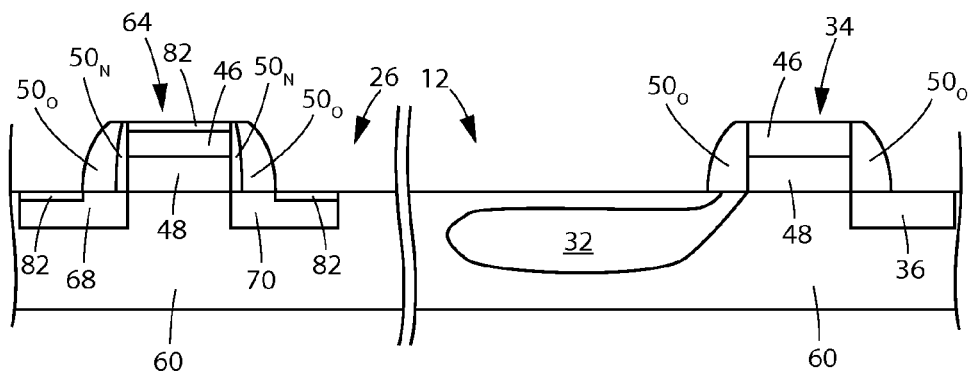

FIG. 4A is a top plan view illustrating one embodiment of a layout of the pixel 30 that may be used in embodiments of imager devices 10 according to the present invention. FIG. 4B is a circuit diagram of the pixel 30 of FIG. 4A. Finally, FIG. 4C is a cross-sectional view of the pixel 30 shown in FIG. 4A taken along section line A-A shown therein. The pixel 30 includes a photodiode 32, a charge transfer transistor 34, a floating diffusion region 36, a reset transistor 38, a source follower transistor 40, and a row select transistor 42. The photodiode 32 and the four transistors together provide a four transistor (4T) pixel circuit. Those of ordinary skill in the art will recognize that the sensor array of imager devices according to embodiments of the present invention, such as the sensor array 12 of the imager device 10, may include any of a wide variety of embodiments of pixels and pixel circuits other than the one illustrated in FIGS. 4A-4C, and that the pixels thereof (e.g., the pixel 30) may include components or devices other than those shown in FIGS. 4A-4C such as, for example, resistors, capacitors, photoconductors, phototransistors and photogates. For example, in some embodiments, each pixel 30 may comprise a three transistor (3T) pixel circuit.

The transistors of the sensor array 12 (i.e., the transistors of the pixel circuits including, for example, the charge transfer transistors 34, the reset transistors 38, the source follower transistors 40, and the row select transistors 42) are collectively referred to herein as the "array transistors." The imager device 10 also may include other transistors not shown in FIGS. 4A and 4B, that are disposed in the peripheral region 26. Such transistors may be used, for example, as pass gates and/or gates of logic circuits of one or more of the other components or subsystems of the imager device including, for example, the row decoder 14, controller 18, column decoder 16, analog-to-digital decoder 20, pixel processor 22, and I/O port 24. These transistors that are disposed in the peripheral region 26 of the imager device 10 are collectively referred to herein as the "peripheral transistors."

FIG. 4C is a partial cross-sectional view of the imager device 10 shown in FIGS. 3A and 3B. The left hand side of FIG. 4C is a cross-sectional view of a portion of the peripheral region 26 of the imager device 10 that includes a peripheral transistor 64. The right hand side of FIG. 4C is a cross-sectional view of the pixel shown in FIG. 4A, taken along section line A-A therein. The transistors of the imager device (including the array transistors and the peripheral transistors) each may include a gate stack comprising a conductive gate region 46 disposed on or over an insulating region 48, as shown on both the peripheral transistor 64 and the charge transfer transistor 34 (which is an array transistor) in FIG. 4C. The conductive gate region 46 is often referred to simply as the "gate" of the transistor, and the insulating region 48 is often referred to as a "gate oxide layer" or a "gate insulating layer" and may comprise, for example, an oxide material. By way of example and not limitation, the insulating region 48 may comprise silica ($SiO_2$). The conductive gate region 46 may comprise, for example, doped polycrystalline silicon (often referred to as "polysilicon").

As known in the art, the conductive gate region 46 is used to selectively provide electrical communication between a source and a drain. For example, the conductive gate region 46 of the peripheral transistor 64 shown on the left hand side of FIG. 4C may be used to selectively provide electrical communication between a source 68 and a drain 70, each of which may comprise, for example, a region of doped polysilicon material. As another example, the conductive gate region 46 of the charge transfer transistor 34 (which is an array transistor) shown on the right hand side of FIG. 4C may be used to selectively provide electrical communication between the photodiode 32 (source) and the floating diffusion region 36 (drain).

While the conductive gate region 46 and the insulating region 48 are shown in the embodiment of FIG. 4C as having equal thicknesses, the thickness of the insulating region 48 may differ from the thickness of the conductive gate region 46 in additional embodiments. For example, the insulating region 48 may be thinner than the conductive gate region 46.

In some embodiments of the present invention, one or more of the transistors of the imager device 10 may have a conductive gate region 46 that includes more than one layer. For example, one or more transistors may have a conductive gate region 46 comprising a layer of silicide material 82 on or over a layer of doped polysilicon material. By way of example and not limitation, the silicide material may comprise cobalt silicide ($CoSi_2$), titanium silicide ($TiSi_2$), or nickel silicide ($NiSi_2$). As shown in FIG. 4C, in some embodiments, only the conductive gate regions 46 of the peripheral transistors may include a silicide layer 82, and the conductive gate regions 46 of array transistors may be substantially free of silicide material.

The resistance of a doped polysilicon material in a conductive gate region 46 of a transistor may be reduced by forming a layer of silicide material 82 on or in the surface of the polysilicon material, which may reduce the overall resistance of the conductive gate regions 46. Reducing the resistance of the conductive gate regions 46 may increase the speed at which the electrical potential or voltage of the conductive gate regions 46 may be switched. In other words, the switching speed of the transistors may be increased by providing a layer of silicide material 82 on or over the polysilicon material of the conductive gate regions 46.

Furthermore, in some embodiments, an additional insulating layer (not shown) may be provided over the insulating region 48, such that the conductive gate region 46 is disposed between two insulating layers.

With continued reference to FIG. 4C, the array transistors and the peripheral transistors may include gate stack sidewall spacers $50_O$, $50_N$ on one or more lateral sides of the conductive gate regions 46 of the transistors. These sidewall spacers $50_O$, $50_N$ may be used to electrically isolate the lateral sides of the conductive gate region 46 from other surrounding elements and prevent electrical shorting therebetween, and may be used to shield regions therebelow from ion implantation during subsequent doping processes.

Although not shown in FIG. 4C, each pixel 30 also may include isolation regions, which may be used to isolate the photodiode 32 from any other element or device in the sensor array 12 (FIG. 3A). Similarly, isolation regions also may be used to isolate the floating diffusion region 36 from other elements or devices in the sensor array 12 (FIG. 3A).

In operation, the reset transistor 38 may be used to place, or set, the potential of the floating diffusion region 36 to a known potential, such as substantially near the potential of the voltage source Vaa. Either before or after setting the floating diffusion region 36 to the known potential, the photodiode 32 may be exposed to radiation. As the radiation impinges on the photodiode 32, electrical charge (e.g., electrons) may be generated in the photodiode 32. The charge transfer transistor 34 may be configured and used to selectively transfer the charge generated by the photodiode 32 onto the floating diffusion region 36. The floating diffusion region 36 may be electrically coupled to the gate of the source follower transistor 40 such that the charge on the floating diffusion region 36 regulates the electrical signal at the drain of the source follower transistor 40. In this configuration, the voltage of the electrical signal at the drain of the source follower transistor 40 may be proportional to the charge on the floating diffusion region 36. The row select transistor 42 may be configured and used to selectively allow the signal at the drain of the source follower transistor 40 to be presented on the output signal Vout of the pixel 30.

Imager devices according to embodiments of the present invention, such as the imager device 10 shown in FIGS. 3A and 3B, may have one or more gate stack sidewall spacers in the sensor array 12 that differ from one or more gate stack sidewall spacers in the peripheral region 26, as discussed in further detail below. For example, the peripheral transistors 64 in the peripheral region 26 may include both nitride gate stack sidewall spacers $50_N$ and oxide gate stack sidewall spacers $50_O$, as shown on the left hand side of FIG. 4C. By way of example and not limitation, such nitride gate stack sidewall spacers $50_N$ may comprise silicon nitride ($Si_3N_4$). In other words, the gate stack sidewall spacers in the peripheral region 26 may have a dual structure comprising both a nitride material (e.g., $Si_3N_4$) and an oxide material (e.g., $SiO_2$). The array transistors, such as the charge transfer transistor 34 shown on the right hand side of FIG. 4C, may include only oxide gate stack sidewall spacers $50_O$, and may be substantially free of nitride material. By way of example and not limitation, such oxide gate stack sidewall spacers $50_O$ may comprise silica ($SiO_2$).

Figure 5:
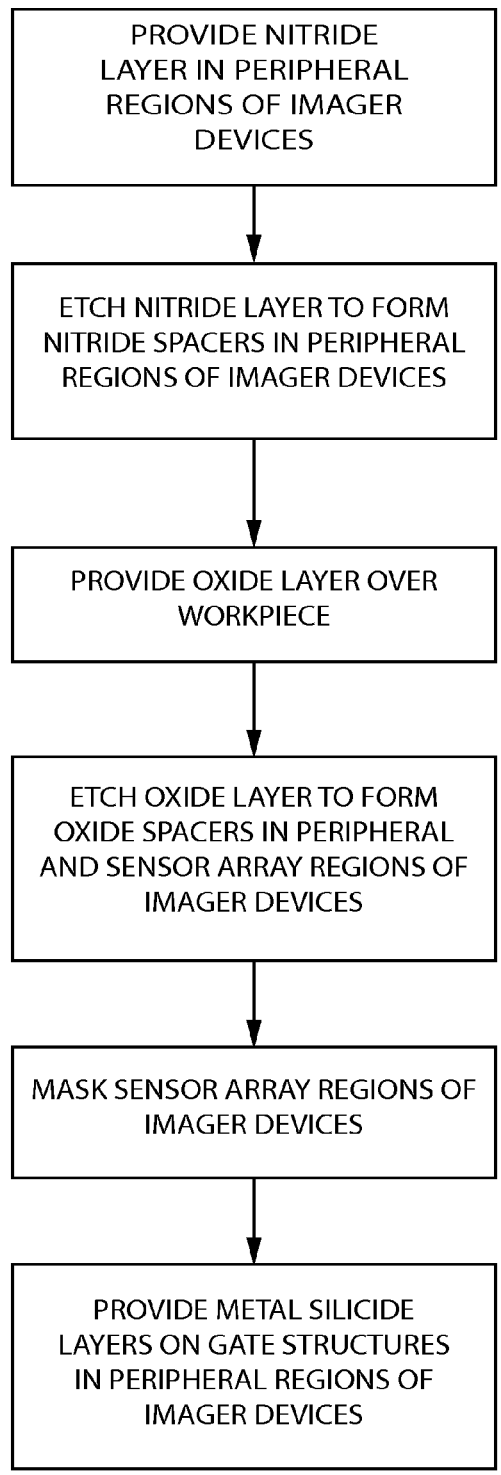
FIGS. 5-7 are block diagrams broadly illustrating embodiments of methods that may be used to fabricate an imager device such as that shown in FIGS. 3A and 3B.

FIG. 5 is a block diagram broadly illustrating methods of the present invention that may be used to fabricate an imager device 10 as shown in FIGS. 3A and 3B that includes gate stack sidewall spacers that differ in the peripheral region 26 and the sensor array 12, as shown in FIG. 4C. As shown in FIG. 5, in some methods of the invention, a layer of nitride material (e.g., silicon nitride) may be deposited on a workpiece that is used to fabricate at least one imager device, and an etching process may be used to form nitride sidewall spacers from the layer of nitride material. After forming the nitride spacers, a layer of oxide material may be deposited on the workpiece, and an etching process may be used to form oxide sidewall spacers from the layer of oxide material. One particular embodiment of the method broadly illustrated in the block diagram shown in FIG. 5 is described below with reference to FIGS. 6A-6I.

Figure 6A:

Referring to FIG. 6A, a wafer or substrate 60 may be provided. The terms "wafer" and "substrate," as used herein, mean any structure that includes a layer of semiconductor type material including, for example, silicon, germanium, gallium arsenide, indium phosphide, and other III-V type semiconductor materials. Substrates and wafers include, for example, silicon-on-insulator (SOI) type substrates, silicon-on-sapphire (SOS) type substrates, and epitaxial layers of silicon supported by a layer of base material. Semiconductor type materials may be doped or undoped. Furthermore, when reference is made to a "wafer" or "substrate" in the following description, previous process steps may have been utilized to at least partially form elements or components of a circuit or device in or over a surface of the wafer or substrate.

Figure 6B:
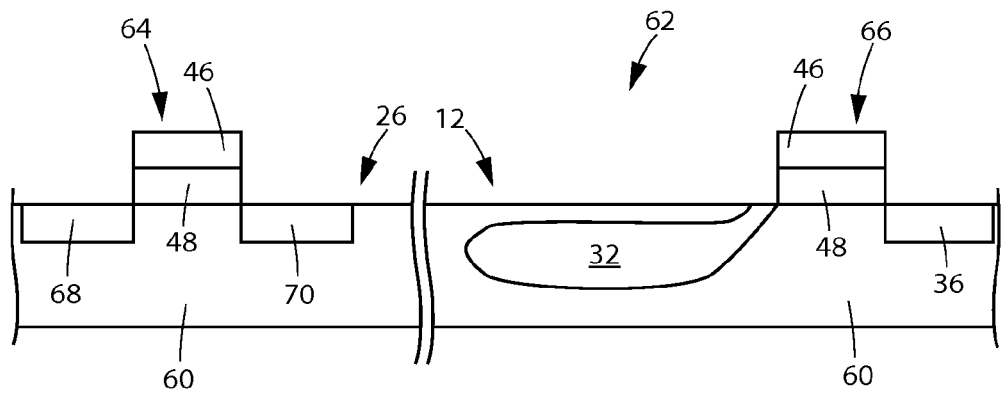

One or more imager devices may be at least partially formed on and/or in a surface of the substrate 60 to form a workpiece 62, an enlarged partial cross-sectional view of which is shown in FIG. 6B. As shown therein, each of the partially formed imager devices may comprise a sensor array 12 and a peripheral region 26, as previously described with reference to FIG. 2. A portion of the peripheral region 26 of one partially formed imager device 10 (FIGS. 3A and 3B) is shown on the left hand side of each of FIGS. 6B-6I, and a portion of the sensor array 12 of that partially formed imager device 10 is shown on the right hand side of each of FIGS. 6B-6I.

As shown in FIG. 6B, the peripheral region 26 may include a plurality of peripheral transistors 64, only one of which is shown in the figures. The peripheral transistors 64 each may include a conductive gate region 46 and an insulating region 48, as previously described in relation to FIG. 4C. As previously discussed herein, the conductive gate region 46 may operate as a gate for selectively providing electrical communication between a source 68 and a drain 70. The conductive gate regions 46, the sources 68, and the drains 70, each may comprise, for example, a doped polysilicon material.

Similarly, the sensor array 12 may comprise a plurality of array transistors 66, only one of which is shown in the figures. The array transistors 66 also may include a conductive gate region 46 and an insulating region 48, and the conductive gate region 46 may operate as a gate for selectively providing electrical communication between a source and a drain. The particular array transistor 66 shown in the figures is a charge transfer transistor (like the charge transfer transistor 34 shown in FIG. 4C), the source comprising a photodiode 32 (or a doped region communicating electrically with the photodiode) and the drain comprising a floating diffusion region 36.

Figure 6C:
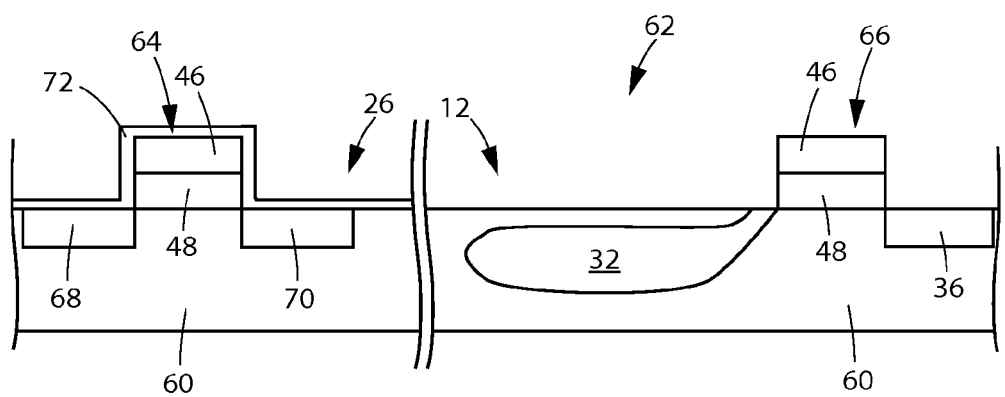

Referring to FIG. 6C, a layer of silicon nitride 72 ($Si_3N_4$) may be selectively provided over the peripheral regions 26 of the partially formed imager devices of the workpiece 62, but not over the sensor arrays 12 of the imager devices. By way of example and not limitation, a conformal layer of silicon nitride 72 may be deposited over the entire workpiece 62 (over the peripheral regions 26 and the sensor arrays 12), after which the silicon nitride 72 may be selectively removed from surfaces of the workpiece 62 overlying the sensor arrays 12. The layer of silicon nitride 72 may have an average thickness of, for example, between about 50 angstroms and about 200 angstroms.

As a non-limiting example, the layer of silicon nitride 72 may be deposited using a chemical vapor deposition (CVD) process that involves reacting a gaseous mixture of dichlorosilane ($SiH_2Cl_2$) and ammonia ($NH_3$) in a CVD chamber at a temperature of between about 600° C. and about 825° C. and at a pressure of about 450 millitorr. Such processes are known in the art. Various other methods of depositing layers of silicon nitride are known in the art and may be used in methods of the present invention.

The silicon nitride 72 may be removed from surfaces of the workpiece 62 overlying the sensor arrays 12 by, for example, masking the workpiece 62 with a photoresist material (positive or negative) and patterning the photoresist material to expose the silicon nitride 72 therethrough at the locations on the workpiece 62 at which it is desired to remove the silicon nitride 72. An etchant that will etch the silicon nitride 72, but not the photoresist material, then may be used to etch the silicon nitride 72 through the patterned mask of photoresist material. For example, an isotropic wet chemical etching process (using an acid such as, for example, phosphoric acid ($H_3PO_4$)) may be used to remove the silicon nitride 72 from regions of the substrate 60 overlying the sensor arrays 12.

Figure 6D:
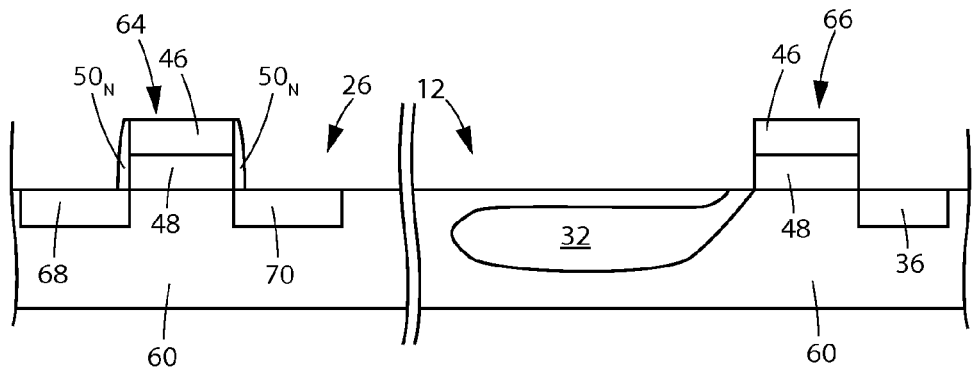

After selectively providing the layer of silicon nitride 72 over the peripheral regions 26 of the partially formed imager devices of the workpiece 62, an anisotropic etching process may be used to form nitride gate stack sidewall spacers $50_N$ on the peripheral transistors 64 of the partially formed imager devices from the layer of silicon nitride 72, as shown in FIG. 6D. Anisotropic etching processes typically involve using an etchant that will etch a layer of material in the vertical direction at a rate that is substantially higher than any rate at which the etchant etches the layer of material in the lateral or horizontal direction. As a non-limiting example, silicon nitride may be anisotropically etched using a dry plasma reactive ion etching (RIE) process. The reactive ion plasma may be generated in a plasma chamber by providing a gaseous mixture of hydrogen and $CF_4$ within the chamber at a pressure of about 25 millitorr and using radio frequencies of electromagnetic radiation to apply a power density of about 0.16 milliwatts per square centimeter. Other methods for anistropically etching layers of silicon nitride are known in the art and may be used in methods of the present invention.

After forming the nitride sidewall spacers $50_N$ on the peripheral transistors 64 of the partially formed imager devices, oxide sidewall spacers may be formed on the array transistors 66 of the partially formed imager devices.

Figure 6E:
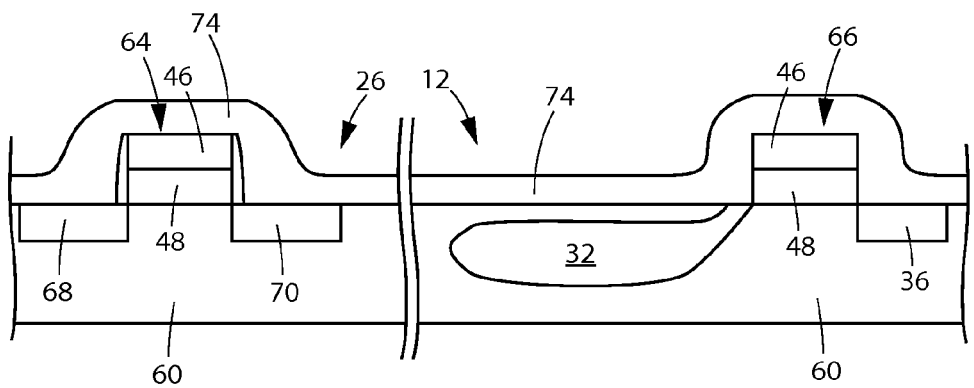

Referring to FIG. 6E, a layer of oxide material 74 such as, for example, silica ($SiO_2$) may be provided over workpiece 62. By way of example and not limitation, a conformal layer of silica 74 may be deposited over the entire workpiece 62 (over the peripheral regions 26 and the sensor arrays 12 of the imager devices) by depositing a layer of tetraethyl orthosilicate (TEOS) ($Si(C_2H_5O)_4$) over the workpiece 62 and decomposing the TEOS to silica ($SiO_2$) at a temperature of about 725° C. As another non-limiting example, silane and oxygen may be reacted at a temperature of about 400° C. in a chemical vapor deposition (CVD) process to deposit a conformal layer of oxide material 74 (i.e., silica) over the entire workpiece 62. Such processes are known in the art. Various other methods of depositing layers of oxide material are known in the art and may be used in methods of the present invention.

Figure 6F:
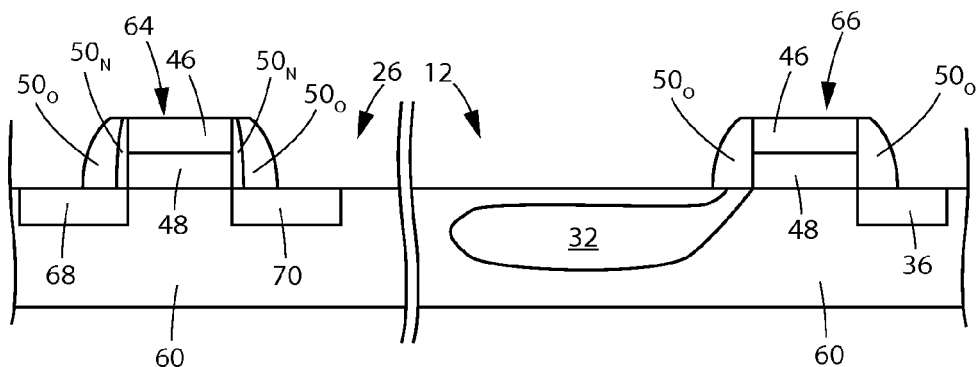

After providing the layer of oxide material 74 over the workpiece 62, an anisotropic etching process may be used to form oxide gate stack sidewall spacers $50_O$ on both the array transistors 66 and the peripheral transistors 64 of the partially formed imager devices from the layer of oxide material 74, as shown in FIG. 6F. As a non-limiting example, the layer of oxide material may be anisotropically etched using a dry plasma reactive ion etching (RIE) process substantially identical to that previously described above in relation to the method for anisotropically etching the layer of silicon nitride 72 to form the nitride sidewall spacers $50_N$. Other methods for anisotropically etching layers of oxide material are known in the art and may be used in methods of the present invention.

As shown in FIG. 6F, the gate stack sidewall spacers $50_N$, $50_O$ of the peripheral transistors 64 may comprise both a nitride material (e.g., silicon nitride ($Si_3N_4$)) and an oxide material (e.g., silica ($SiO_2$)). In other words, the gate stack sidewall spacers of the peripheral transistors 64 may have a double or dual structure comprising both a nitride sidewall spacer $50_N$ (i.e., a nitride region) and an oxide sidewall spacer $50_O$ (i.e., an oxide region). Furthermore, the nitride sidewall spacers $50_N$ may be disposed between the oxide sidewall spacers $50_O$ and the associated conductive gate regions 46 of the peripheral transistors 64. Furthermore, the array transistors 66 may comprise oxide sidewall spacers $50_O$, and may be substantially free of any nitride material.

After forming the dual structure gate stack sidewall spacers $50_N$, $50_O$ on the peripheral transistors 64 and the oxide sidewall spacers $50_O$ on the array transistors 66, a layer of metal silicide material may be formed on exposed surfaces of polysilicon material in the peripheral regions 26 of the partially formed imager devices of the workpiece 26.

Figure 6G:
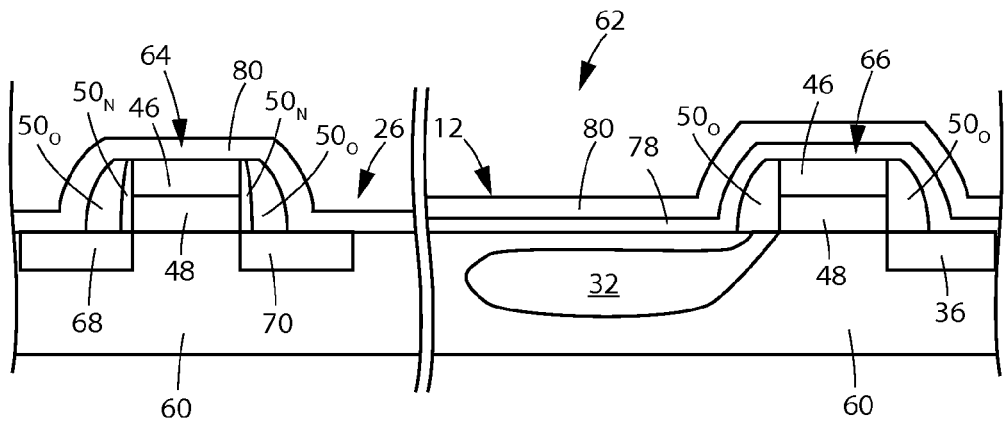

For example, as shown in FIG. 6G, a mask layer 78 may be selectively provided on the regions of the workpiece 62 overlying the sensor arrays 12 of the partially formed imager devices. By way of example and not limitation, the mask layer 78 may comprise a layer of silica ($SiO_2$) formed by decomposition of tetraethyl orthosilicate (TEOS), as previously described herein. After forming or otherwise providing the mask layer 78 on the workpiece 62, a metal layer 80 may be deposited over the peripheral regions 26 of the partially formed imager devices, as also shown in FIG. 6G. The metal layer 80 may comprise, for example, a layer of cobalt, tungsten, titanium, or nickel. The metal layer 80 may be deposited by sputtering, for example, and may have an average thickness of between about 200 angstroms and about 400 angstroms.

Figure 6H:
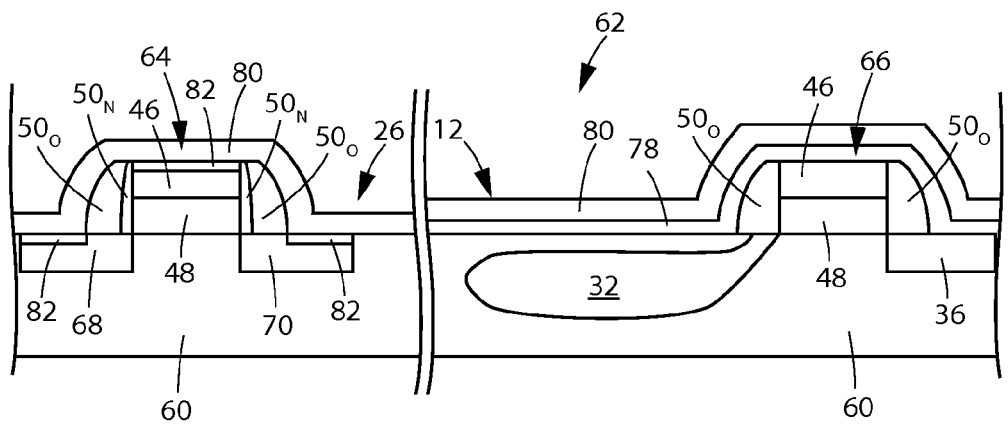

Referring to FIG. 6H, after forming or otherwise providing the metal layer 80, the workpiece 62 may be annealed at a temperature of between about 500° C. and about 800° C. in an inert environment (e.g., nitrogen atmosphere) to cause the metal in the metal layer 80 to react with underlying polysilicon material to form a metal silicide layer 82 on/or in the surfaces of the underlying regions of polysilicon material in the peripheral regions 26 of the partially formed imager devices. As previously discussed, the conductive gate regions 46 of the peripheral transistors 64 may comprise a doped polysilicon material, and thus, a metal silicide layer 82 may be formed thereover upon annealing of the metal layer 80, as shown in FIG. 6H. Similarly, various sources 68 and drains 70 also may comprise a doped polysilicon layer, and a metal silicide layer 82 also may be formed thereover upon annealing of the metal layer 80, as also shown in FIG. 6H.

By way of example and not limitation, the metal silicide layers 82 may comprise cobalt silicide ($CoSi_2$), tungsten silicide ($WSi_2$), titanium silicide ($TiSi_2$), or nickel silicide (NiSi).

Metal silicide layers 82 may not be formed at areas other than the interface between the metal layer 80 and silicon material. As such, the metal silicide layers 82 may comprise so called "self-aligned silicide" layers, which are often referred to as "salicide" layers.

Figure 6I:
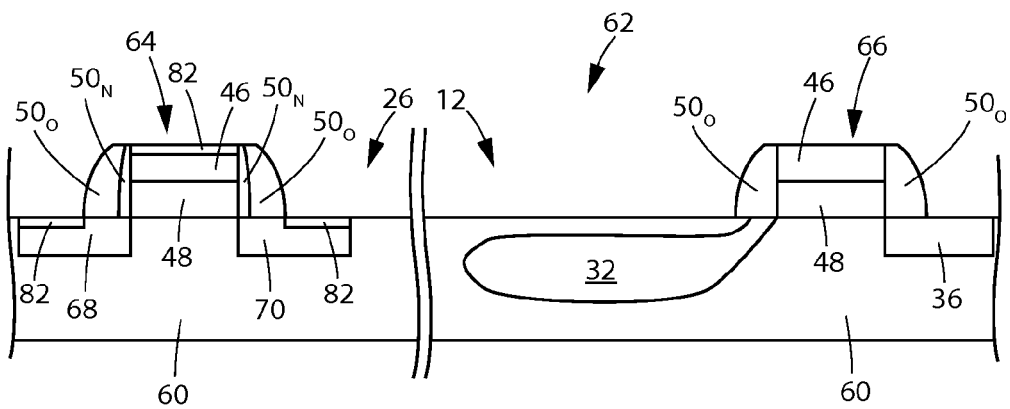

After forming the metal silicide layers 82, the metal layer 80 and the mask layer 78 may be removed from the workpiece 62, as shown in FIG. 6I. By way of example and not limitation, the metal layer 80 may be removed by wet etching the metal layer 80 in ammonium hydroxide ($NH_4OH$) and hydrogen peroxide ($H_2O_2$). The mask layer 78 may be removed using standard dry etching or wet etching techniques known in the art.

In some methods, one or more additional annealing processes may be performed to selectively tailor the phase or microstructure of the silicide layers 82, as necessary or desired.

Although not shown in the figures, the workpiece 62 may be subjected to additional processes to complete fabrication and packaging of the imager devices so as to provide completed imager devices, such as those illustrated in FIGS. 3A and 3B. In particular, the imager devices may be coated or covered with an insulating material (not shown), and may be singulated from the workpiece 62 so as to provide a plurality of individual and discrete imager devices. As known in the art, the imager devices may be packaged after singulation from the workpiece 62, prior to singulation from the workpiece 62, or partially before and partially after singulation from the workpiece 62.

Figure 7:
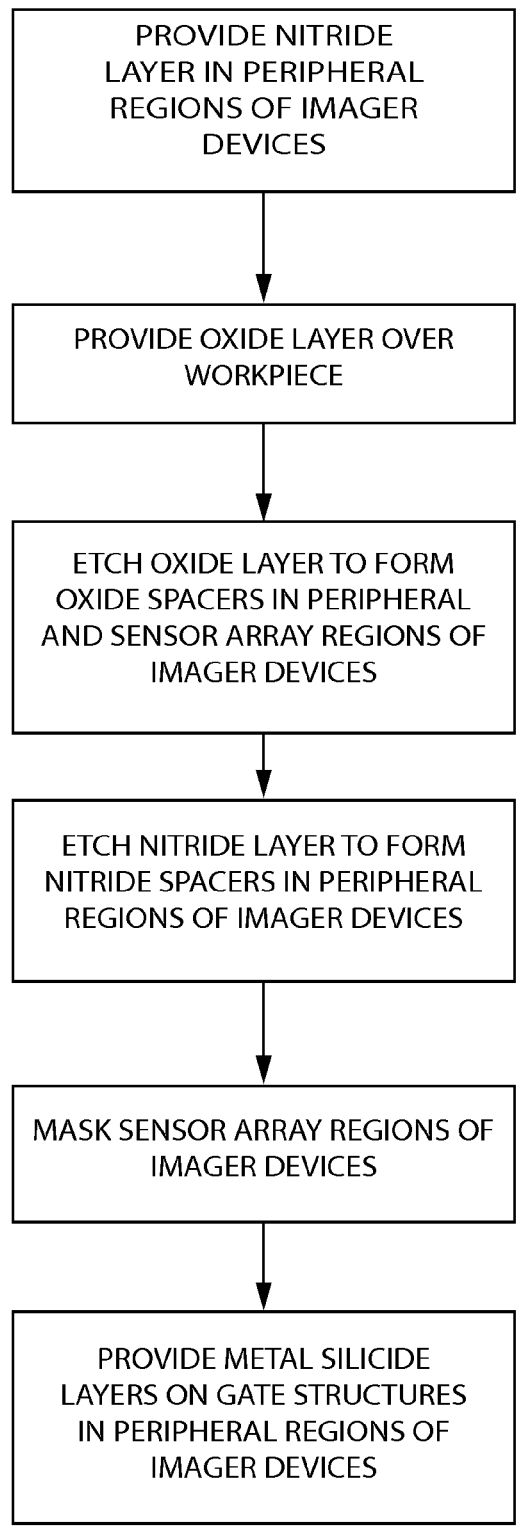

FIG. 7 is a block diagram broadly illustrating additional embodiments of methods of the present invention that may be used to fabricate an imager device such as that shown in FIGS. 3A and 3B. As shown therein, a layer of nitride material (e.g., silicon nitride) and a layer of oxide material (e.g., silica) may be deposited on a workpiece that is used to fabricate at least one imager device. An etching process may be used to form oxide sidewall spacers from the layer of oxide material. Another etching process may be used to form nitride sidewall spacers from the layer of nitride material after forming the oxide sidewall spacers. One particular embodiment of the method broadly illustrated in the block diagram shown in FIG. 7 is described below with reference to FIGS. 8A-8E.

Figure 8A:
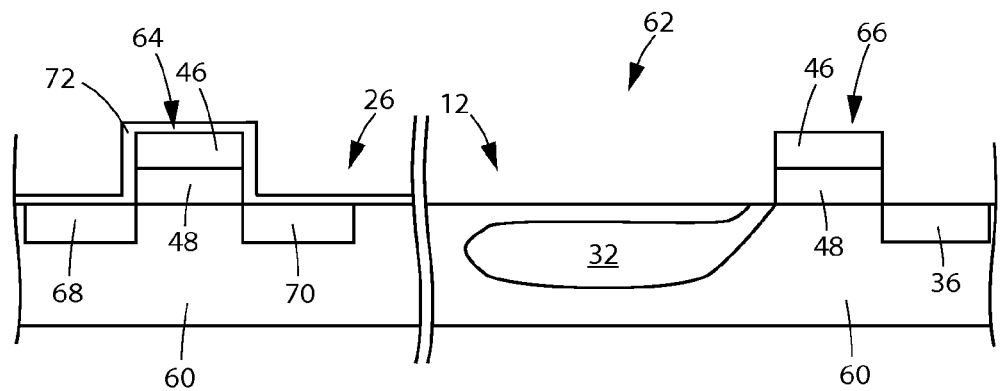
FIGS. 8A-8E illustrate one embodiment of a method that corresponds to the method broadly illustrated in the block diagram shown in FIG. 5.

FIG. 8A is substantially identical to FIG. 6C. As previously described with reference to FIGS. 6A-6C, the workpiece 62 shown in FIG. 8A may be fabricated from the substrate 60 shown in FIG. 6A.

Figure 8B:
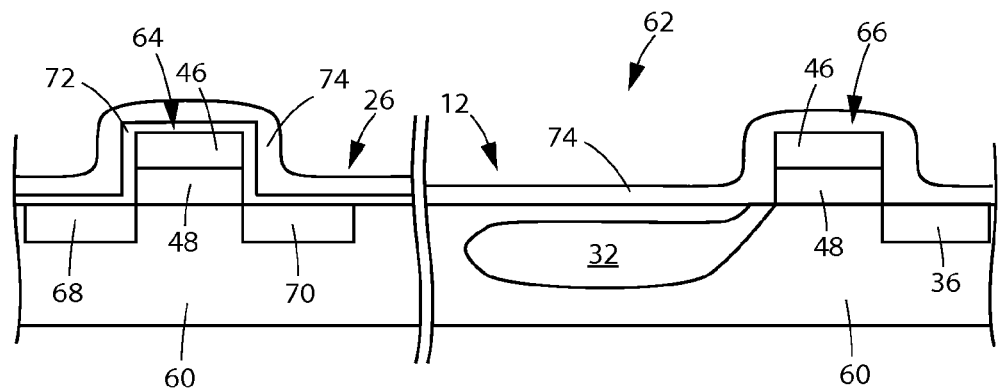

Referring to FIG. 8B, a layer of oxide material 74 such as, for example, silica ($SiO_2$) may be provided over the workpiece 62. By way of example and not limitation, a conformal layer of silica 74 may be deposited over the entire workpiece 62 (over the peripheral regions 26 and the sensor arrays 12 of the imager devices) by depositing a layer of tetraethyl orthosilicate (TEOS) ($Si(C_2H_5O)_4$) over the workpiece 62 and decomposing the TEOS to silica ($SiO_2$) at a temperature of about 725° C. As another non-limiting example, silane and oxygen may be reacted at a temperature of about 400° C. in a chemical vapor deposition (CVD) process may be used to deposit a conformal layer of oxide material 74 (i.e., silica) over the entire workpiece 62. Various other methods of depositing layers of oxide material are known in the art and may be used in methods of the present invention.

Figure 8C:
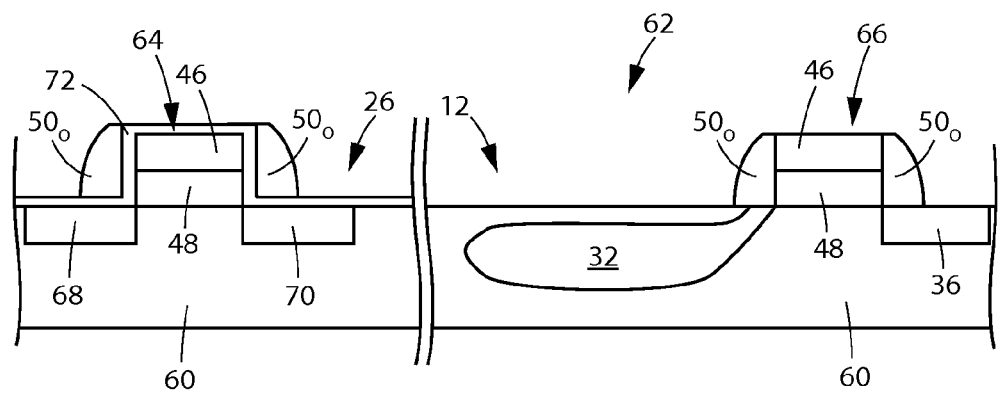

Referring to FIG. 8C, an anisotropic etching process may be used to form oxide gate stack sidewall spacers 50$_O$ on both the array transistors 66 and the peripheral transistors 64 of the partially formed imager devices from the layer of oxide material 74, in a manner substantially identical to that previously described with reference to FIG. 6F. As a non-limiting example, the layer of oxide material may be anisotropically etched using a dry plasma reactive ion etching (RIE) process as previously described herein.

Figure 8D:
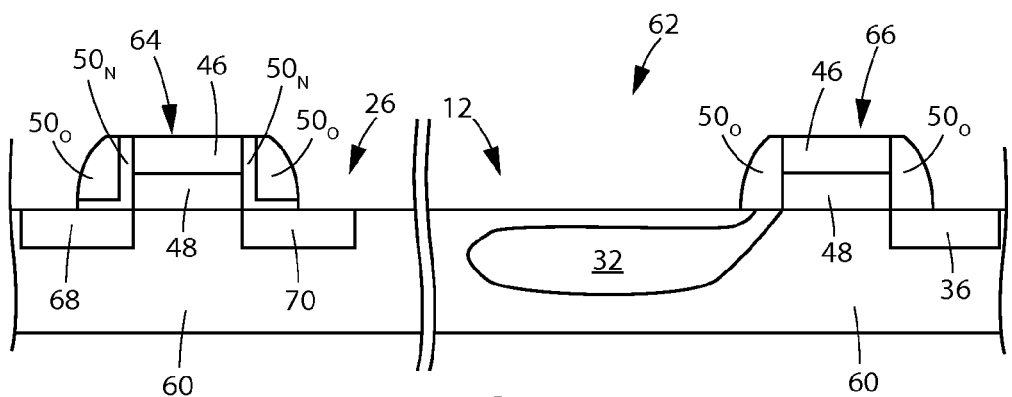

After forming the oxide gate stack sidewall spacers 50$_O$ on both the array transistors 66 and the peripheral transistors 64, another anisotropic nitride etching process may be used to form nitride gate stack sidewall spacers 50$_N$ on the peripheral transistors 64 of the partially formed imager devices from the previously deposited layer of silicon nitride 72, as shown in FIG. 8D. As shown in FIG. 8D, the gate stack sidewall spacers of the peripheral transistors 64 may comprise both a nitride material (e.g., silicon nitride ($Si_3N_4$)) and an oxide material (e.g., silica ($SiO_2$)). In other words, the gate stack sidewall spacers 50$_N$, 50$_O$ of the peripheral transistors 64 may have a double or dual structure comprising both a nitride sidewall spacer 50$_N$ (i.e., a nitride region) and an oxide sidewall spacer 50$_O$ (i.e., an oxide region). Furthermore, the nitride sidewall spacers 50$_N$ may be disposed between the oxide sidewall spacers 50$_O$ and the associated conductive gate regions 46 of the peripheral transistors 64. In the embodiment shown in FIG. 8D, the nitride sidewall spacers 50$_N$ of the peripheral transistors 64 have an L-shaped cross-section, the vertically-extending portion of which is disposed between and laterally separates the conductive gate regions 46 from the oxide sidewall spacers 50$_O$, and the horizontally-extending portion of which is disposed between and vertically separates the sources 68 and drains 70 from the oxide sidewall spacers 50$_O$. The array transistors 66 may comprise oxide sidewall spacers 50$_O$, and may be substantially free of any nitride material.

Figure 8E:
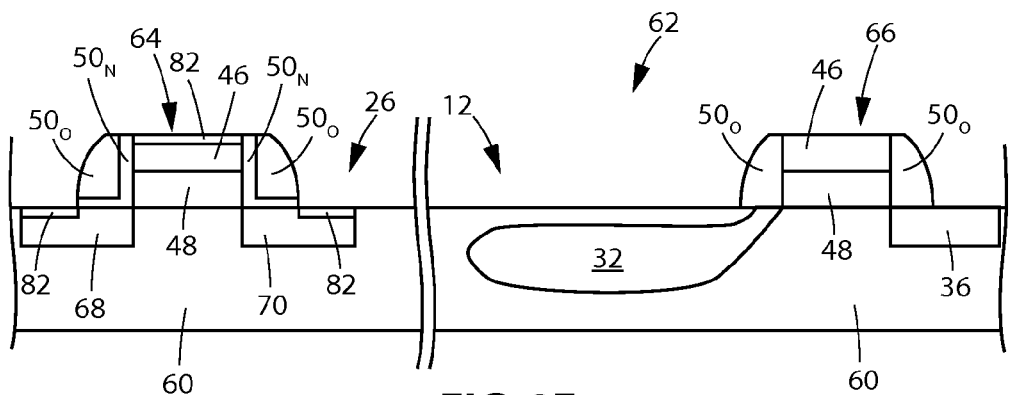

As shown in FIG. 8E, layers of silicide material 82 optionally may be formed on exposed surfaces of polysilicon material in the peripheral regions 26 of the partially formed imager devices of the workpiece 26 in the manner previously described herein with reference to FIGS. 6G-6I. In such embodiments, the sensor arrays 12 may be substantially free of the silicide materials.

Figure 9:
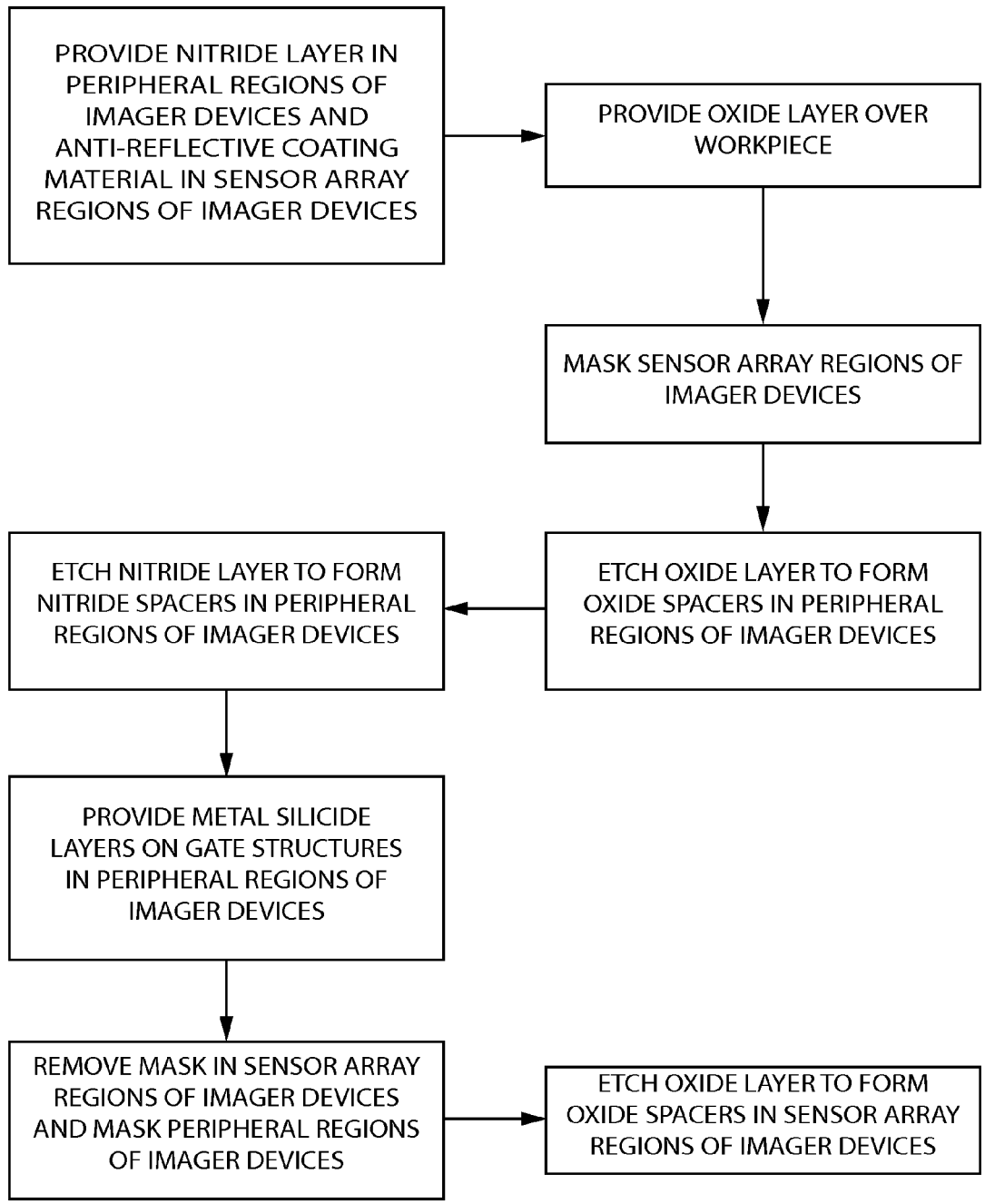
FIG. 9 illustrates one embodiment of a method that corresponds to the method broadly illustrated in the block diagram shown in FIG. 7.

FIG. 9 is a block diagram broadly illustrating yet additional embodiments of methods of the present invention that may be used to fabricate an imager device such as that shown in FIGS. 3A and 3B. As shown therein, a layer of nitride material (e.g., silicon nitride) and a layer of oxide material (e.g., silica) may be deposited on a workpiece that is used to fabricate at least one imager device. After masking the sensor array of the imager device, etching processes may be used to form oxide sidewall spacers and nitride sidewall spacers on transistors in the peripheral region of the imager device. Optionally, metal silicide layers may be provided on transistors (e.g., gates, sources, and/or drains) in the peripheral region of the imager device. The mask may be removed from the sensor array, and the peripheral region of the imager device may be covered with a mask. Another etching process then may be used to form oxide sidewall spacers on transistors in the sensor array. One particular embodiment of the method broadly illustrated in the block diagram shown in FIG. 9 is described below with reference to FIGS. 10A-10H.

Figure 10A:
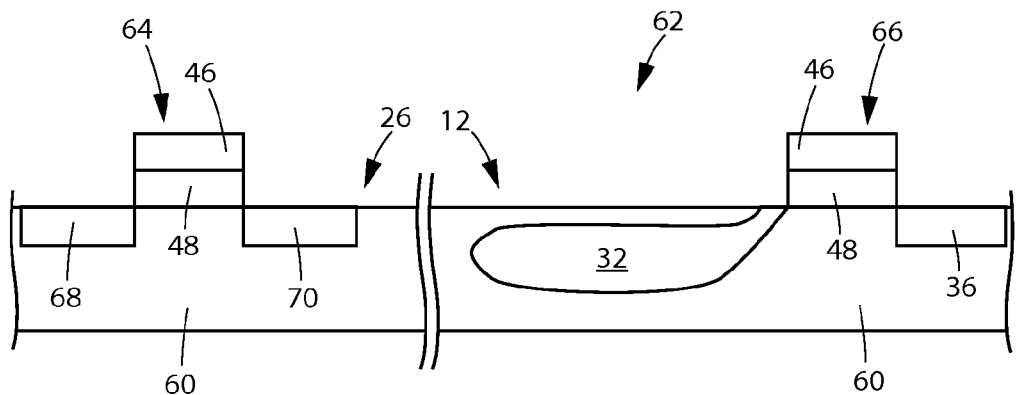
FIGS. 10A-10I illustrate one embodiment of a method that corresponds to the method broadly illustrated in the block diagram shown in FIG. 9.

FIG. 10A is substantially identical to FIG. 6B. As previously described with reference to FIGS. 6A and 6B, the workpiece 62 shown in FIG. 10A may be fabricated from the substrate 60 shown in FIG. 6A.

Figure 10B:
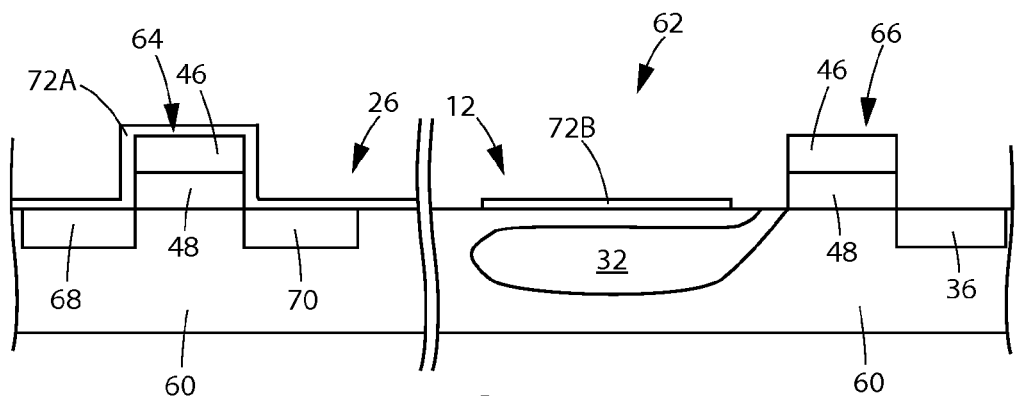

Referring to FIG. 10B, a layer of silicon nitride 72A ($Si_3N_4$) may be selectively provided over the peripheral regions 26 of the partially formed imager devices of the workpiece 62, and a layer of silicon nitride 72B ($Si_3N_4$) may be selectively provided over the photodiodes 32 (or other photosensitive devices) in the sensor arrays 12 of the partially formed imager devices. By way of example and not limitation, a conformal layer of silicon nitride ($Si_3N_4$) may be blanket deposited over the entire workpiece 62 (over the peripheral regions 26 and the sensor arrays 12 of the imager devices), after which the silicon nitride may be selectively removed from the workpiece 62 using a mask and etch process so as to define the layer of silicon nitride 72A in the peripheral regions 26 and the layer of silicon nitride 72B over the photodiodes 32 in the sensor arrays 12. As discussed in further detail below, the layer of silicon nitride 72B over the photodiodes 32 in the sensor arrays may be used as an anti-reflective coating (ARC) for minimizing or reducing reflection of electromagnetic radiation that is incident on the imager devices in the regions overlying the photodiodes 32. The layers of silicon nitride 72A, 72B may have an average thickness of, for example, between about 50 angstroms and about 200 angstroms.

Figure 10C:
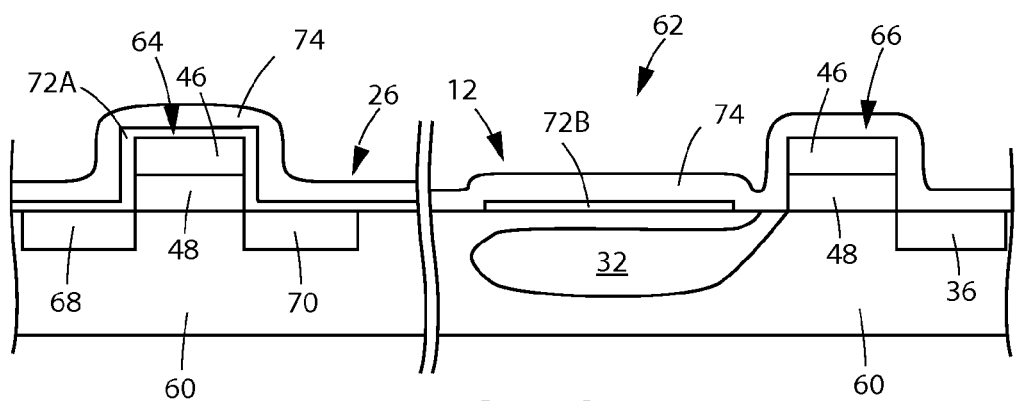

Referring to FIG. 10C, a layer of oxide material 74 such as, for example, silica ($SiO_2$) may be provided over the workpiece 62. By way of example and not limitation, a conformal layer of silica 74 may be blanket deposited over the entire workpiece 62 (over the peripheral regions 26 and the sensor arrays 12 of the imager devices) using the methods previously described herein.

Figure 10D:
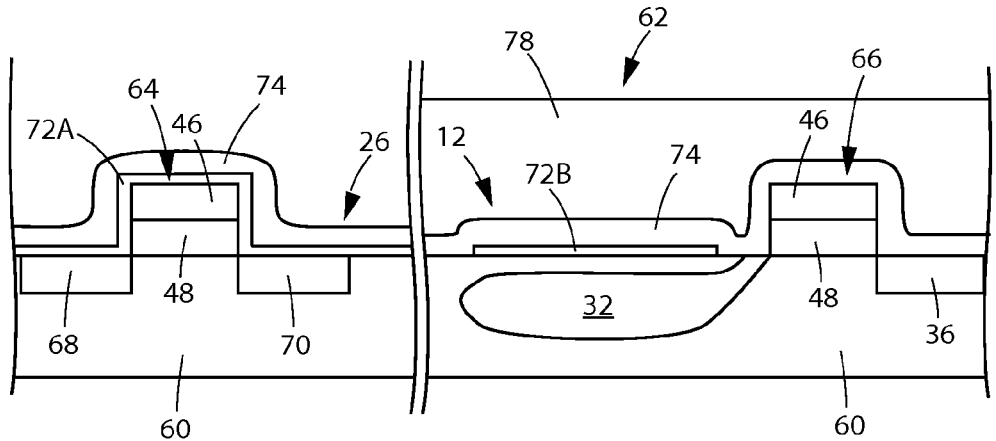

As shown in FIG. 10D, a mask layer 78 then may be provided over the sensor arrays 12 of the partially formed imager devices on the workpiece 62. The mask layer 78 may comprise a material that is resistant to an etchant used to etch the layer of oxide material 74. By way of example and not limitation the mask layer 78 may comprise a photoresist material. In other embodiments, the mask layer 78 may comprise a layer of nitride material (e.g., $Si_3N_4$), which may be patterned using a masking and etching process.

Figure 10E:
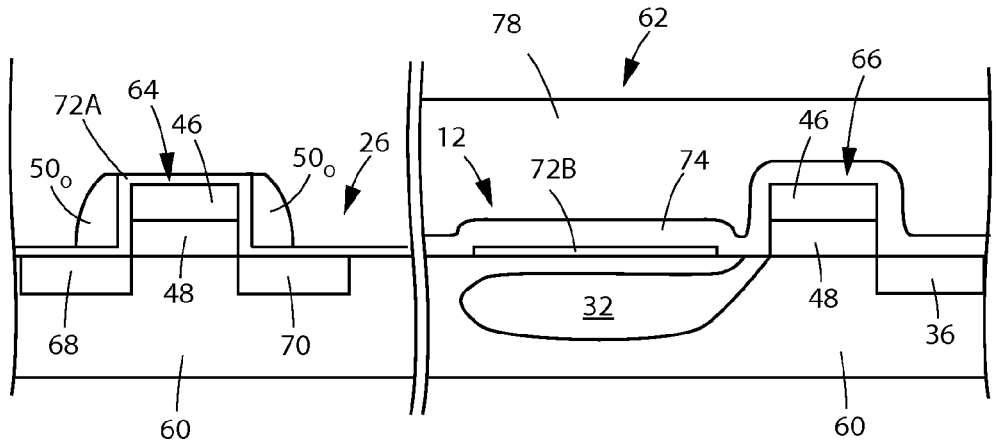
Figure 10F:
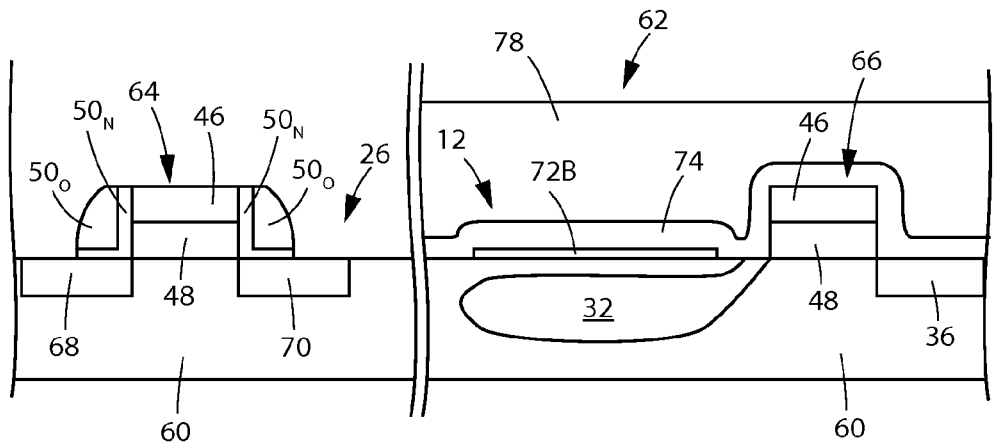

After providing the mask layer 78 over the sensor arrays 12 on the workpiece 62, an anisotropic etching process may be used to form oxide sidewall spacers $50_O$ on the peripheral transistors 64 in the peripheral regions 26 of the partially formed imager devices of the workpiece 62, as shown in FIG. 10E. After forming the oxide sidewall spacers $50_O$ on the peripheral transistors 64, portions of the nitride layer 72A may be exposed. Another etching process, which also may be anisotropic, then may be used to form nitride sidewall spacers $50_N$ on the peripheral transistors 64 in the peripheral regions 26 of the partially formed imager devices of the workpiece 62, as shown in FIG. 10F. The gate stack sidewall spacers $50_O$, $50_N$ of the peripheral transistors 64 shown in FIG. 10F are substantially similar to the gate stack sidewall spacers $50_O$, $50_N$ of the peripheral transistors 64 previously described with reference to FIG. 8D, and have an L-shaped cross-section.

Figure 10G:
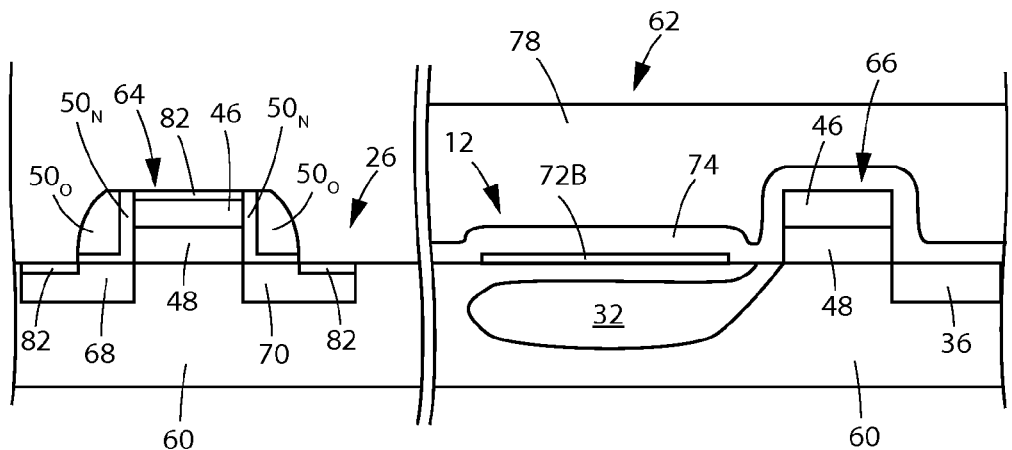

Referring to FIG. 10G, after forming the gate stack sidewall spacers $50_O$, $50_N$ on the peripheral transistors 64, layers of silicide material 82 optionally may be formed on exposed surfaces of polysilicon material in the peripheral regions 26 of the partially formed imager devices of the workpiece 26 in the manner previously described herein with reference to FIGS. 6G-6I if the mask layer 78 comprises a layer of nitride material.

Figure 10H:
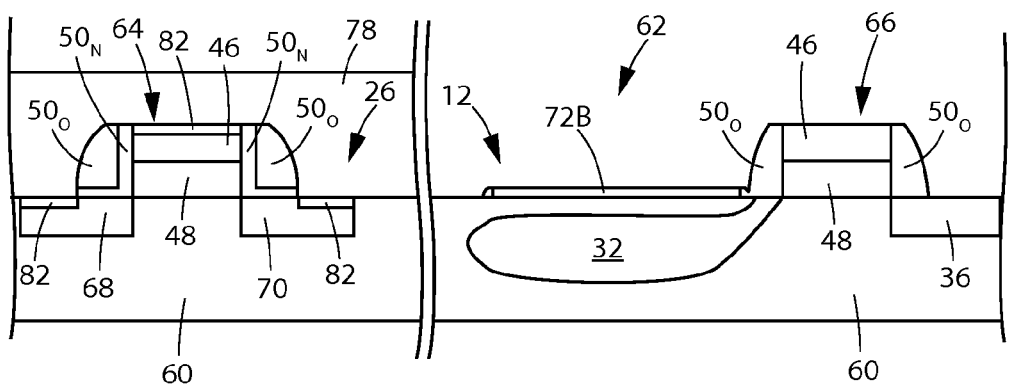

As shown in FIG. 10H, the mask layer 78 may be removed from the sensor arrays 12 on the workpiece 62, and another anisotropic etching process may be used to form oxide sidewall spacers $50_O$ on the array transistors 66 of the sensor arrays 26 of the partially formed imager devices of the workpiece 62. Optionally, another mask layer 78 may be provided over the peripheral regions 26 of the partially formed imager devices to prevent removal of oxide material from the oxide sidewall spacers $50_O$ previously formed on the peripheral transistors 64, as also shown in FIG. 10H.

Figure 10I:
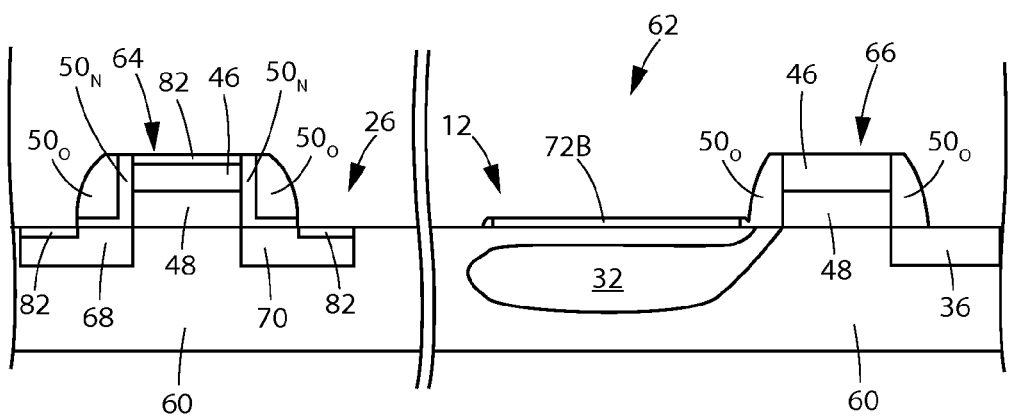

After forming the gate stack sidewall spacers $50_O$ on the array transistors 66, the optional mask layer 78 in the peripheral regions 26 may be removed from the workpiece 62, as shown in FIG. 10I.

As previously described herein, imager devices of the present invention may have gate stack sidewall spacers on transistors in the peripheral regions of the imager devices that include a nitride material (e.g. $Si_3N_4$) while sidewall spacers on transistors in the sensor array regions of the imager devices may be substantially free of silicon nitride. Layers of silicide material (e.g., $CoSi_2$) also may be selectively provided on or over layers of polysilicon material in the peripheral regions of the imager devices, which may enhance the electrical performance (e.g., switching speed) of the transistors in the peripheral regions of the imager devices. The presence of the nitride material in the sidewall spacers on transistors in the peripheral regions of the imager devices may hinder or prevent the formation of silicide material on the sidewall spacers (often referred to as "silicide stringers") in the peripheral region, thereby preventing or minimizing the occurrence of shorting between the gate and the source and/or drain of the transistors.

The transistors in the sensor array regions of imager devices of the present invention may be substantially free of silicide and nitride materials. Silicide materials in the sensor array region of an imager device may contribute to unwanted current leakages, which may contribute to so-called "dark current" (i.e., current generated in the sensor array from sources other than photons) and degraded signal-to-noise ratios. Furthermore, by minimizing or eliminating the use of nitride materials in the sensor array region of the imager devices, stress arising in the sensor array region due to thermal expansion mismatch between silicon-based material and such nitride materials may be reduced or eliminated, which may enhance durability of the imager devices.

In other words, the transistors in the peripheral region of imager devices, which may be used as pass gates or logic gates, may be physically configured to enhance and/or optimize electrical performance (e.g., switching speed and/or signal-to-noise ratio), while the transistors in the sensor array region of the imager devices may be physically configured to enhance and/or optimize optical performance and durability of the sensor array.

Embodiments of imager devices of the present invention, such as the imager device 10 shown in FIGS. 1, 2, 3A, and 3B, may be used to provide embodiments of imaging systems of the present invention.

Figure 11:
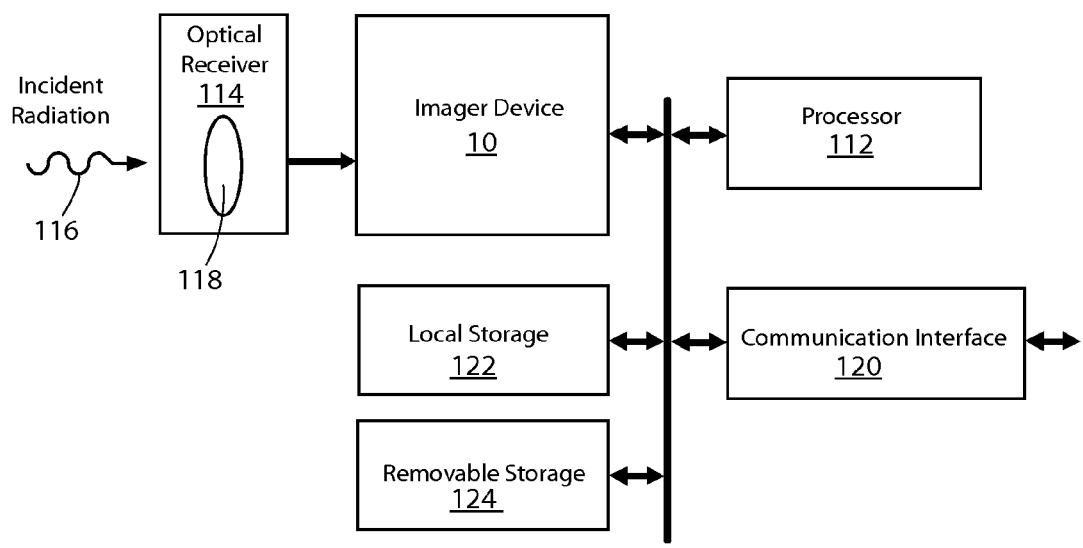
FIG. 11 is a simplified block diagram illustrating an embodiment of an imaging system that includes the imager device shown in FIGS. 3A and 3B.

FIG. 11 is a simplified block diagram illustrating one embodiment of an imaging system 110 according to the present invention. In some embodiments, the imaging system 110 may comprise, for example, a digital camera, a cellular telephone, a computer, a personal digital assistant (PDA), or any other device or system capable of capturing an electronic representation of an image. The imaging system includes an imager device that embodies teachings of the present invention, such as the imager device 10 previously described herein. The imaging system 110 may include an electronic signal processor 112 for receiving electronic representations of images from the imager device 10 and communicating the images to other components of the imaging system 110. The imaging system 110 may also include an optical receiver 114 for channeling, focusing, or modifying incident radiation 116 (e.g., visible light) and otherwise presenting an image to the imager device 10. For example, the optical receiver 114 may include a lens 118 for focusing the incident radiation 116 onto the imager device 10.

The imaging system 110 also may include a communication interface 120 for transmitting and receiving data and control information. In some embodiments, the imaging system 10 also may include one or more memory devices. By way of example and not limitation, the imaging system may include a local storage device 122 (e.g., a read-only memory (ROM) device and/or a random access memory (RAM) device) and a removable storage device 124 (e.g., flash memory).

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:
1. An imager device, comprising:
a sensor array comprising a plurality of array transistors substantially free of silicide material and each having gate stack sidewall spacers substantially free of nitride material; and a peripheral region at least partially surrounding the sensor array, the peripheral region comprising a plurality of peripheral transistors, each comprising:
- at least one gate stack sidewall spacer comprising nitride material; and
- silicide material on at least a portion of at least one of a gate, a source, and a drain of each respective peripheral transistor, wherein the plurality of array transistors comprises:
- a plurality of reset transistors;
- a plurality of source follower transistors; and
- a plurality of row select transistors, wherein the peripheral region is free of the plurality of array transistors.

2. The imager device of claim 1, wherein the array transistors each have gate stack sidewall spacers comprising an oxide material.

3. The imager device of claim 1, wherein the peripheral transistors of the plurality each comprise at least one gate stack sidewall spacer having a first region comprising a nitride material and a second region comprising an oxide material.

4. The imager device of claim 3, wherein the nitride material is disposed between the oxide material and at least a portion of a gate.

5. The imager device of claim 4, wherein the at least a portion of the gate comprises the silicide material.

6. The imager device of claim 4, wherein the nitride material is disposed between the oxide material and at least a portion of at least one of a source and a drain.

7. The imager device of claim 5, wherein the at least a portion of at least one of a source and a drain comprises the silicide material.

8. An imager device, comprising:
- a sensor array comprising a plurality of array transistors, at least one array transistor of the plurality having at least one gate stack sidewall spacer substantially free of nitride material; and
- a peripheral region at least partially surrounding the sensor array, the peripheral region comprising a plurality of peripheral transistors, at least one peripheral transistor of the plurality having at least one gate stack sidewall spacer comprising nitride material, wherein the plurality of array transistors comprises:
- a plurality of reset transistors;
- a plurality of source follower transistors; and
- a plurality of row select transistors, wherein the peripheral region is free of the plurality of array transistors.

* * * * *